United States Patent [19]
Noda

[11] Patent Number: 5,395,453
[45] Date of Patent: Mar. 7, 1995

[54] APPARATUS AND METHOD FOR CONTROLLING OSCILLATION OUTPUT OF MAGNETRON

[75] Inventor: Shozo Noda, Kawasaki, Japan

[73] Assignee: Fujitsu Limited, Kawasaki, Japan

[21] Appl. No.: 215,810

[22] Filed: Mar. 22, 1994

[30] Foreign Application Priority Data

Jul. 29, 1993 [JP] Japan .................. 5-188479

[51] Int. Cl.$^6$ ............................. C23C 16/50
[52] U.S. Cl. .................. 118/723 R; 118/723 MW; 118/723 ME; 156/345; 156/643; 427/575
[58] Field of Search ... 118/723 R, 723 MP, 723 MW, 118/723 ME, 723 MR, 723 MA, 723 AN; 156/345, 643; 427/569, 575

[56] References Cited

U.S. PATENT DOCUMENTS

| | | |
|---|---|---|
| 4,405,904 | 9/1983 | Oida et al. .................. 331/87 |
| 5,043,680 | 8/1991 | Gurwicz .................. 331/86 |

FOREIGN PATENT DOCUMENTS 1-149965  6/1989  Japan .
3-261136  11/1991  Japan .

Primary Examiner—R. Bruce Brenehan
Assistant Examiner—Jonathan D. Baskin
Attorney, Agent, or Firm—Nikaido, Marmelstein, Murray & Oram

[57] ABSTRACT

An apparatus for controlling an oscillation output of a magnetron includes a switch circuit controlled of ON/OFF states thereof by a pulse signal, a rectifying circuit for supplying microwave power pulses to the magnetron, and a transformer having a primary side and a secondary side. The primary side has a first terminal and a second terminal, where the first terminal is connected to an A.C. power supply, the second terminal is connected to the switch circuit. The secondary side is connected to the rectifying circuit. The switch circuit is turned ON/OFF by the pulse signal so that a duty factor of the microwave power pulses output from the rectifying circuit and a repetition frequency of the duty cycle thereof become constant.

17 Claims, 11 Drawing Sheets

APPARATUS AND METHOD FOR CONTROLLING OSCILLATION OUTPUT OF MAGNETRON

BACKGROUND OF THE INVENTION

The present invention generally relates to apparatuses for controlling oscillation outputs of magnetrons, and more particularly to an apparatus for controlling an oscillation output of a magnetron by stably supplying a-microwave power.

In the fabrication of semiconductor devices, etching processes and CVD processes are performed by a microwave plasma treatment using a magnetron. To control the microwave output of the magnetron, the microwave power should be stably supplied to the magnetron and also be finely controlled. In the fabrication of LSIs, the microwave plasma treatment should be performed at a high speed and with a high accuracy.

FIG. 1 shows an example of a conventional apparatus for controlling an oscillation output of a magnetron. Referring to FIG. 1, the apparatus generally comprises a transformer T1, diodes D1 and D2, and high-voltage capacitors C1 and C2. A magnetron 100 is connected to a heater power supply 110. A two-phase power supply voltage having a frequency of 50 Hz and an A.C. voltage of 200 V is applied to a primary side of the transformer T1. The voltage of a secondary side of the transformer T1 is made m times the voltage of the primary side thereof. The voltage on the secondary side is subjected to a full-wave rectification by the diodes D1 and D2. A microwave power that is output from the apparatus is determined by capacitances of the high voltage capacitors C1 and C2. Thus, when the frequency of the microwave power is 50 Hz, a current Ib applied to an anode of the magnetron 100 has a waveform shown in FIG. 2. In this case, the microwave power is 1500 W.

FIG. 3 shows another example of a conventional apparatus for controlling an oscillation output of a magnetron. Referring to FIG. 3, the apparatus generally comprises a transformer T2, a thyristor circuit 101, and a rectifying circuit 102. A magnetron 100 is connected to a heater power supply 110. A two-phase power supply voltage having a frequency of 50 Hz and an A.C. voltage of 200 V is applied to a primary side of the transformer T2. The voltage of a secondary side of the transformer T2 is controlled by a current control on the primary side. A microwave power that is output from the apparatus is supplied to the magnetron 100 through the rectifying circuit 102. Thus, when the frequency of the microwave power is 50 Hz, a current Ib applied to an anode of the magnetron 100 has a waveform shown in FIG. 4. In this case, the microwave power is 1500 W.

In the prior art shown in FIG. 1, the microwave output of the magnetron 100 is fixed. Thus, the magnetron 100 could not be made to make the so-called soft-start and soft-stop. In addition, depending on a plasma impedance (hereinafter simply referred to as an impedance) in a chamber, an excessively large load may be applied on the magnetron 100, resulting in an oscillation failure. When the load on the magnetron 100 is excessively large, the cathode and anode of the magnetron 100 become short-circuited. For this reason, the current that flows through the anode of the magnetron 100 increases from a normal value between 0.4 and 0.7 A to a large value of 200 A in a short time of several tens of μsec. As a result, there was also a problem in that the magnetron 100 itself or the apparatus will be damaged.

On the other hand, in the prior art shown in FIG. 3, the microwave output of the magnetron 100 can be variably controlled. However, in this case, to obtain a high microwave output, the peak value of the current applied to the anode of the magnetron 100 must be set to a high value. As a result, the load on the magnetron 100 became high, resulting in shortening the serviceable life of the magnetron 100.

Therefore, in the prior arts described above, the microwave output of the magnetron 100 could not be stably controlled to stably generate the microwave plasma, and it was difficult to make the microwave plasma treatment at a high speed with a high accuracy.

On the other hand, an apparatus that generates plasma in the pulse form by use of pulse power has been proposed in a Japanese Laid-Open Patent Application No. 1-149965. In this proposed apparatus, a combination of the pulse width of a voltage or current supplied to the magnetron, the frequency, the amplitude, and the number of pulses is modulated, so as to control an intermittent timing in which the pulse voltage or current is not modulated. Thus, the pulse form of the generated plasma differs from the pulse form of the pulse voltage or current supplied to the magnetron. However, this proposed apparatus controls the combination of the pulse width of the voltage or current, the frequency, the amplitude, and the number of pulses, thereby requiring complex control and circuitry. As a result, there was a problem in that the apparatus became bulky and expensive.

Another apparatus that supplies a pulse voltage or current to a magnetron has been proposed in a Japanese Laid-Open Patent Application No.3-261136. In this proposed apparatus., the duty factor of the pulse voltage or current is set in the range of ½ to 1/50, and the pulse width (half width value of peak current) is set in the range of 0.1 to 20 μsec. However, unless the duty factor and pulse width of the pulse voltage or current supplied to the magnetron are constant, there was a problem in that the serviceable life of the magnetron becomes short.

Furthermore, since each of the proposed apparatuses described above uses pulse modulation to control the microwave output of the magnetron, the intensity of plasma emission becomes irregular. When the intensity of plasma emission is irregular, there was a problem in that it is difficult to control a light-end-point detection unit that detects the intensity of plasma emission within a chamber in which the plasma is generated.

SUMMARY OF THE INVENTION

Accordingly, it is a general object of the present invention to provide a novel and useful apparatus for controlling oscillation output of magnetron, in which the problems described above are eliminated.

Another and more specific object of the present invention is to provide an apparatus for controlling an oscillation output of a magnetron, comprising a switch circuit controlled of ON/OFF states thereof by a pulse signal, a rectifying circuit supplying microwave power pulses to the magnetron, and a transformer having a primary side and a secondary side, the primary side having a first terminal and a second terminal, the first terminal being coupled to an A.C. power supply, the second terminal being coupled to the switch circuit, the secondary side being coupled to the rectifying circuit, the switch circuit being controlled of the ON/OFF states thereof by the pulse signal so that a duty factor of the microwave power pulses output from the rectifying circuit and a repetition frequency of the duty cycle thereof-become constant. According to the apparatus of the present invention, the switch circuit is turned ON/OFF by the pulse signal so that the duty factor of microwave power pulses and the repetition frequency of the duty factor thereof become constant. Thus, since the microwave power pulses are-regular pulses that are not modulated, they do not cause the serviceable life of the magnetron to be shortened. In addition, since the intensity of plasma emission does not become irregular, a light-end-point detection unit that detects the intensity of plasma emission in a chamber in which the plasma is generated can be easily controlled. Moreover, by controlling the switch circuit ON/OFF, desired microwave power pulses can be generated using a simple circuit construction and simple control. Hence, the microwave output of the magnetron can be stably controlled, thereby realizing stable generation of the microwave plasma. As a result, the microwave plasma treatment can be performed at a high speed and with a high accuracy.

A further object of the present invention is to provide a plasma processing method comprising the steps of (a) supplying microwave power to a magnetron from a rectifying circuit, (b) controlling an oscillation output of the magnetron by controlling ON/OFF states of a switch circuit by a pulse signal so that a duty factor of the microwave power pulses output from the rectifying circuit and a repetition frequency of the duty cycle thereof become constant, and (c) generating plasma using the magnetron. According to the plasma processing method of the present invention, the switch circuit is turned ON/OFF by the pulse signal so that the duty factor of microwave power pulses and the repetition frequency of the duty factor thereof become constant. Thus, since the microwave power pulses are regular pulses that are not modulated, they do not cause the serviceable life of the magnetron to be shortened. In addition, since the intensity of plasma emission does not become irregular, a light-end-point detection unit that detects the intensity of plasma emission in a chamber in which the plasma is generated can be-easily controlled. Moreover, by controlling the switch circuit ON/OFF, desired microwave power pulses can be generated using a simple circuit construction and simple control. Hence, the microwave output of the magnetron can be stably controlled, thereby realizing stable generation of the microwave plasma. As a result, the microwave plasma treatment can be performed at a high speed and with a high accuracy.

Other objects and further features of the present invention will be apparent from the following detailed description when read in conjunction with the accompanying drawings.

DESCRIPTION OF THE PREFERRED EMBODIMENTS.

The present invention eliminates the aforementioned problems by an apparatus for controlling an oscillation output of a magnetron, comprising a switch circuit SW1 that is turned ON and OFF by a pulse signal, a rectifying circuit D3, D4, C3 for supplying microwave power pulses to the magnetron, and a transformer T3 having a primary side and a secondary side, the primary side having a first terminal and a second terminal, the first terminal being coupled to an A.C. power supply, the second terminal being coupled to the switch circuit SW1, the secondary side being connected to the rectifying circuit D3, D4, C3, wherein the switch circuit SW1 is turned ON/OFF by the pulse signal so that a duty factor of the microwave power pulses output from the rectifying circuit D3, D4, C3 and a repetition frequency of the duty cycle thereof become constant.

The switch circuit SW1 is turned ON/OFF by the pulse signal so that the duty factor of microwave power pulses and the repetition frequency thereof become constant.

Since the microwave power pulses are regular pulses that are not modulated, the microwave power pulses do not shorten the serviceable life of the magnetron. In addition, since the intensity of plasma emission will not become irregular, a light-end-point detection unit that detects the intensity of plasma emission in a chamber in which the plasma is generated can be controlled with ease. Moreover, because the desired microwave power pulses are generated by controlling the ON/OFF state of the switch circuit SW1, the microwave output of the magnetron can be stably controlled and a stable microwave plasma can be realized by use of a simple circuit construction and simple control. For this reason, the microwave plasma treatment can be performed at a high speed with a high accuracy.

Next, a description will be given of embodiments of the present invention.

Figure 1:
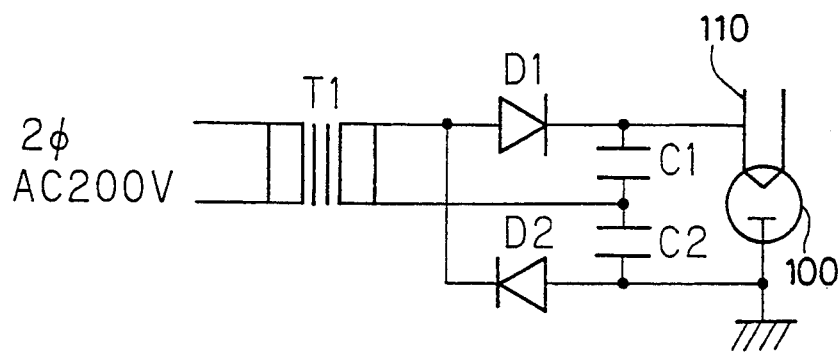
FIG. 1 is a circuit diagram showing an example of a conventional apparatus for controlling an oscillation output of a magnetron.
Figure 2:
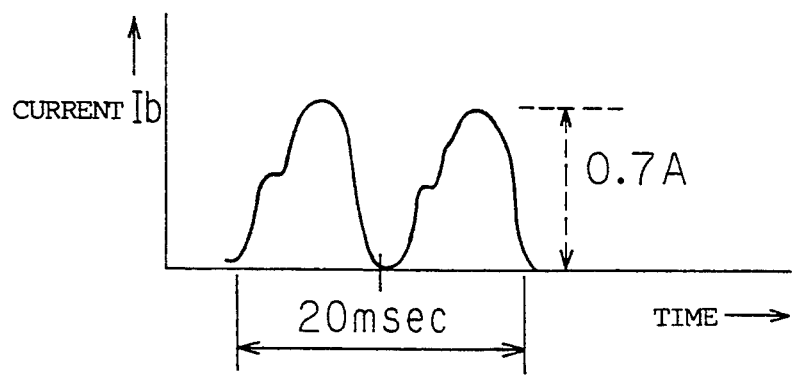
FIG. 2 is a diagram showing a waveform of a current applied to an anode of the magnetron shown in FIG. 1.
Figure 3:
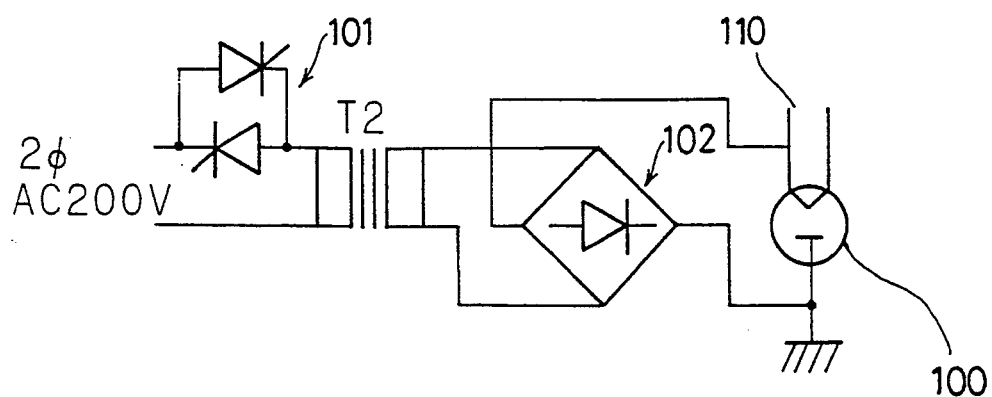
FIG. 3 is a circuit diagram showing another example of the conventional apparatus for controlling the oscillation output of the magnetron.
Figure 4:
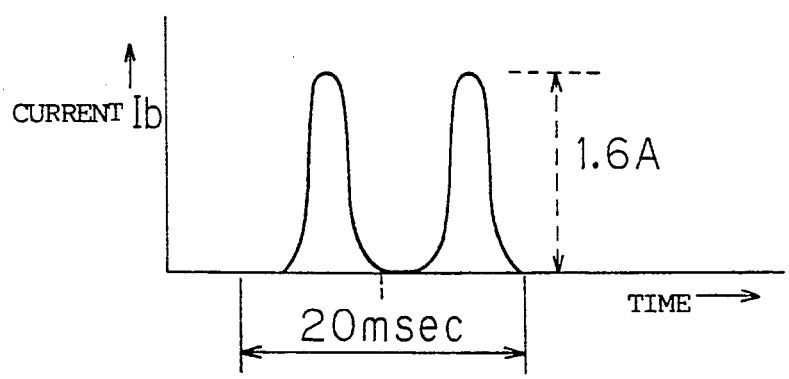
FIG. 4 is a diagram showing a waveform of a current applied to the anode of the magnetron shown in FIG. 3.
Figure 5:
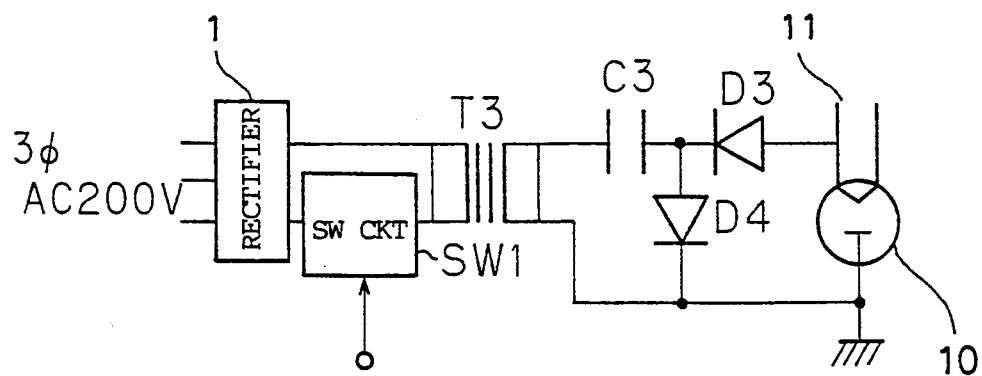
FIG. 5 is a circuit diagram showing a first embodiment of an apparatus for controlling an oscillation output of a magnetron according to the present invention.
Figure 6:
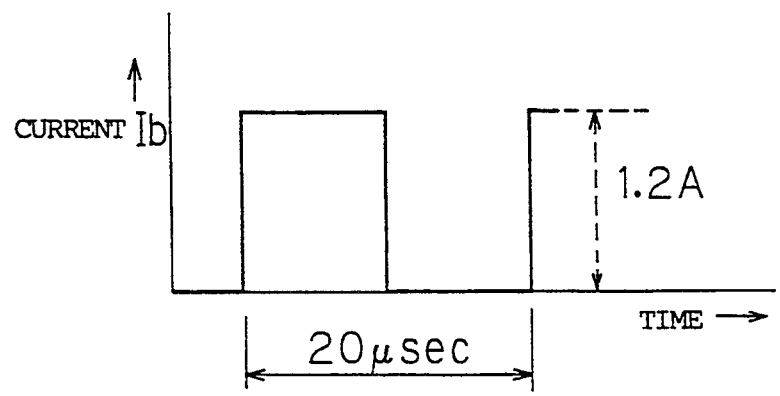
FIG. 6 is a diagram showing a waveform of a current applied to an anode of the magnetron shown in FIG. 5.

FIG. 5 shows a first embodiment of an apparatus for controlling an oscillation output of a magnetron according to the present invention. Referring to FIG.5, the apparatus generally comprises a rectifier 1, a switch circuit SW1, a transformer T3, diodes D3 and D4, and a capacitor C3. A magnetron 10 is connected to a heater power supply 11. A three-phase power supply voltage having a frequency of 50 Hz and an A.C. voltage of 200 V is applied to a primary side of the transformer T3 through the rectifier 1. A voltage on a secondary side of the transformer T3 is m times that on the primary side, and is subjected to a half-wave rectification by the diodes D3 and D4. The duty factor of the ON/OFF state of the switch circuit SW1 and the repetition frequency of the duty factor thereof are kept constant during a normal operation of the magnetron 10. When the duty factor of the ON/OFF state of the switch circuit SW1 is 50% and the repetition frequency of the duty factor thereof is 50 kHz, for example, a current Ib applied to an anode of the magnetron 10 has a waveform shown in FIG. 6. In this case, the microwave power is 1500 W.

Even if the duty factor of the ON/OFF state of the switch circuit SW1 and the repetition frequency of the duty factor thereof are constant, the variable control of the microwave output of the magnetron 10 and the control of the oscillation efficiency can be controlled appropriately by controlling an intermittent timing of the microwave power pulses. For this reason, an optimum microwave output most efficient for the microwave plasma treatment can be obtained. In addition, when performing an etching process by the microwave plasma treatment, the etching rate can be stably controlled.

Figure 7:
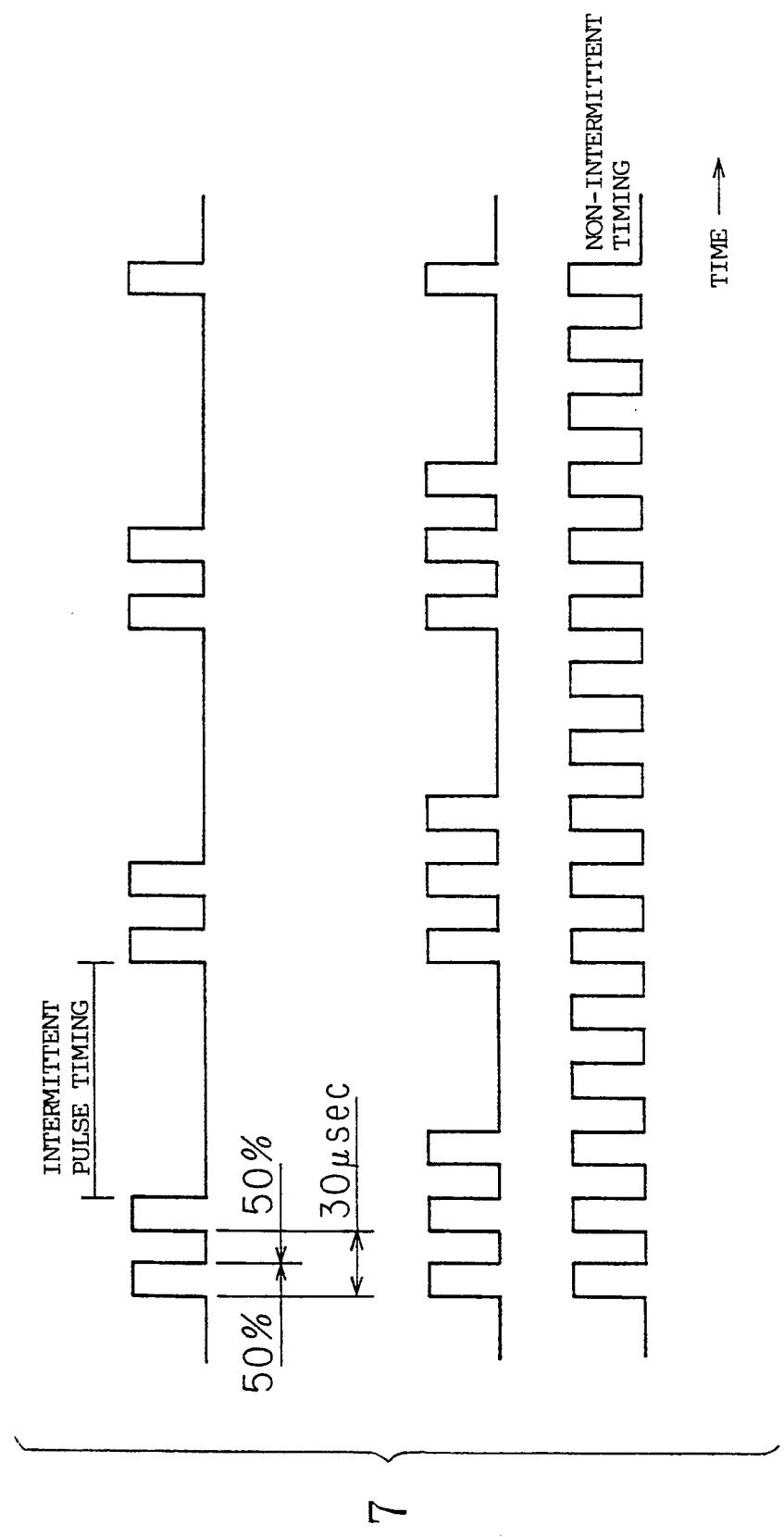
FIG. 7 is a timing diagram for explaining an intermittent timing control of microwave power pulses in the first embodiment.

FIG. 7 is a timing diagram for explaining the control of the intermittent timing of the microwave power pulses. The intermittent timing of the microwave power pulses is controlled by controlling the ON/OFF time periods of the switch circuit SW1 by a central processing unit (CPU, not shown), for example. In FIG. 7, when an intermittent pulse timing indicated by (a) is shortened, an intermittent pulse timing indicated by (b) is obtained. When the intermittent pulse timing indicated by (b) is further shortened, a non-intermittent timing indicated by (c) is obtained.

Figure 8:
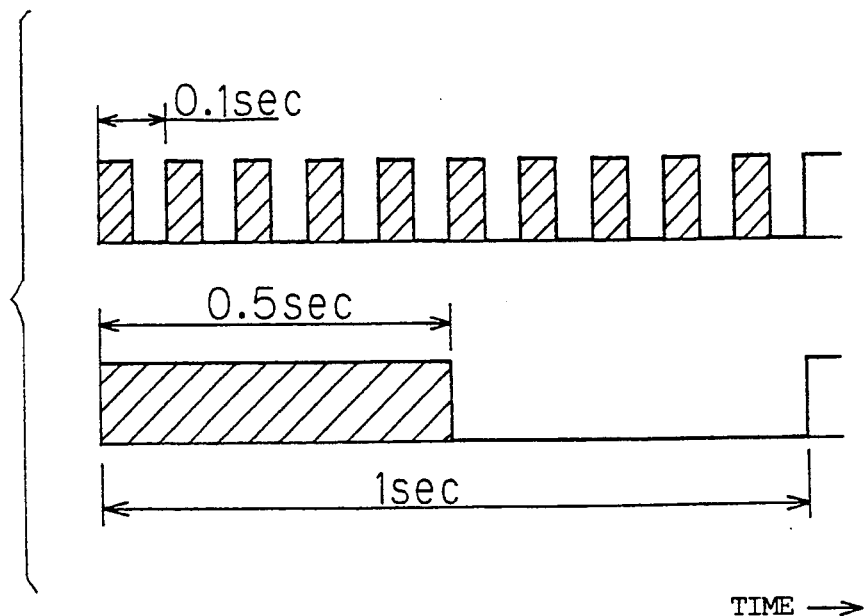
FIG. 8 is a timing diagram showing non-intermittent timings of pulse currents applied to the anode of the magnetron.

FIG. 8 shows a case where the pulse current applied to the anode of the magnetron 10 has non-intermittent timings. In FIG. 8, a case where a non-intermittent timing is 0.05 sec/10 pulses is indicated by (a), and a case where a non-intermittent timing is 0.5 sec/pulse is indicated by (b). The microwave effective output (effective area) is the same for the case indicated by (a) and the case indicated by (b) in FIG. 8. However, as will be described later, even if the same microwave effective output (effective area) with the same duty factor are obtained within 1 sec, the etching rate becomes higher for the case where the pulse current indicated by (a) in FIG. 8 is applied to the magnetron 10 if the repetition frequencies of the duty factors differ for the two cases as indicated by (a) and (b) in FIG. 8. This is because, when viewed in terms of the microwave plasma energy, the energy at the repetition of the duty factor converges with a time constant, and as an etching process, the etching rate becomes higher for the case indicated by (a).

Figure 9:
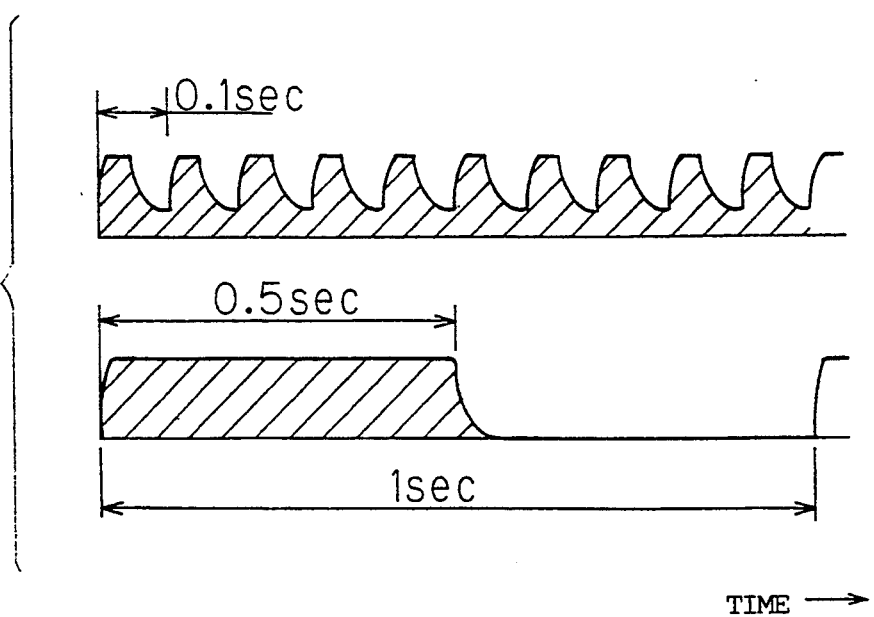
FIG. 9 is a timing diagram showing microwave outputs of the magnetron for the case where the pulse currents shown in FIG. 8 are applied to the magnetron.

FIG. 9 shows microwave outputs of the magnetron 10 when the pulse currents shown in FIG. 8 are applied to the magnetron 10. In FIG. 9, a microwave output of the magnetron 10 when the pulse current (a) of FIG. 8 is applied to the magnetron 10 is indicated by (a), and a microwave output of the magnetron 10 when the pulse current (b) of FIG. 8 is applied to the magnetron 10 is indicated by (b). As is clearly seen from (a) and (b) of FIG. 9, even for the same microwave output, the number of active seeds generated greatly differs between the cases (a) and (b) shown in FIG. 9 due to the different life span of the active seeds. The amount of active seeds that contribute to the etching process for the case (a) shown in FIG. 9 is larger than that for the case (b) shown in FIG. 9, and thus, the etching rate for the case (a) shown in FIG. 9 is higher than that for the case (b) shown in FIG. 9. When the repetition period of the duty factor becomes 30 μsec or greater, the etching rate is saturates at a duty factor repetition period of 30 μsec or greater since the quantity of active seeds no longer varies.

Figure 10A:
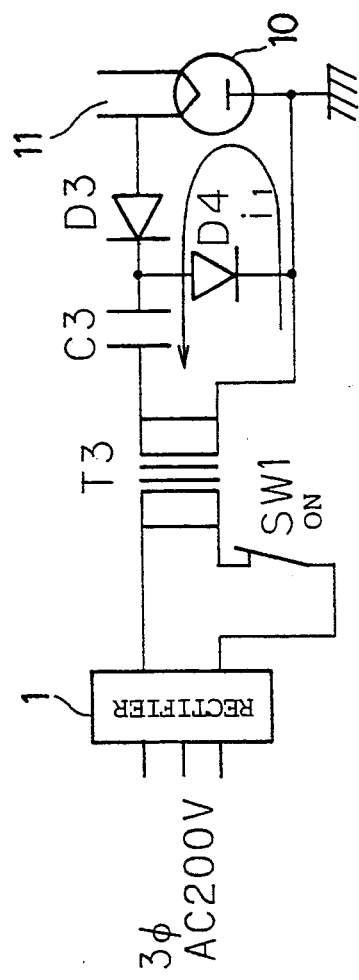
FIGS. 10A and 10B respectively are circuit diagrams for explaining the first embodiment when a switching circuit is ON and OFF.

FIG. 10A shows a state where the switch circuit SW1 is ON in FIG. 5. In this state, a current i1 flows in an arrow direction in FIG. 10. Thus, the capacitor C3 is not charged and the anode voltage of the magnetron 10 does not reach a D.C. voltage of 4 kV, for example, which is a normal voltage. For this reason, the magnetron 10 does not oscillate.

Figure 10B:
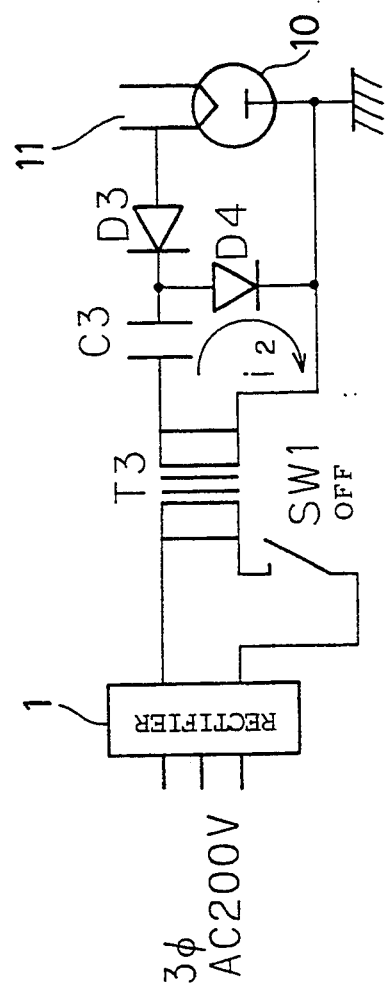

On the other hand, FIG. 10B shows a state where the switch circuit SW1 is OFF in FIG. 5. In this state, a current i2 flows in an arrow direction in FIG. 10B due to the back electromotive force. Thus, the energy that is charged in the transformer T3 during the ON state of the switch circuit SW1 is charged in the capacitor C3. Thereafter, when the switch circuit SW1 is turned ON again, the energy stored in the capacitor C3 and the energy applied to the transformer T3 are added. Hence, the anode voltage of the magnetron 10 reaches the normal D.C. voltage of 4 kV, and the magnetron 10 oscillates, thereby generating a microwave output. In this embodiment, the aforementioned m is set and the boost is made so that the voltage of the secondary side of the transformer T3 becomes 2 kV when the voltage of the primary side of the transformer T3 is in the range of 260 to 300 V, for example.

In this embodiment, the duty factor of the microwave power pulses applied to the magnetron 10 is set to 50% so that an excessively large load will not be applied to the magnetron 10. The peak value of the microwave power pulses is set to two time the average anode current of the magnetron 10. However, the peak value of the microwave power pulses is set so as not to exceed the maximum anode peak current of the magnetron 10. In addition, the repetition frequency of the duty factor of the microwave power pulses is set to 50 kHz, which is the maximum switching speed of the switch circuit SW1. When the duty factor of the microwave power pulses applied to the magnetron 10 is set to 50%, the self-heating load of the magnetron 10 is reduced, and the serviceable life of the magnetron 10 can be extended than using a repetition frequency of a constant duty factor.

Figure 11:
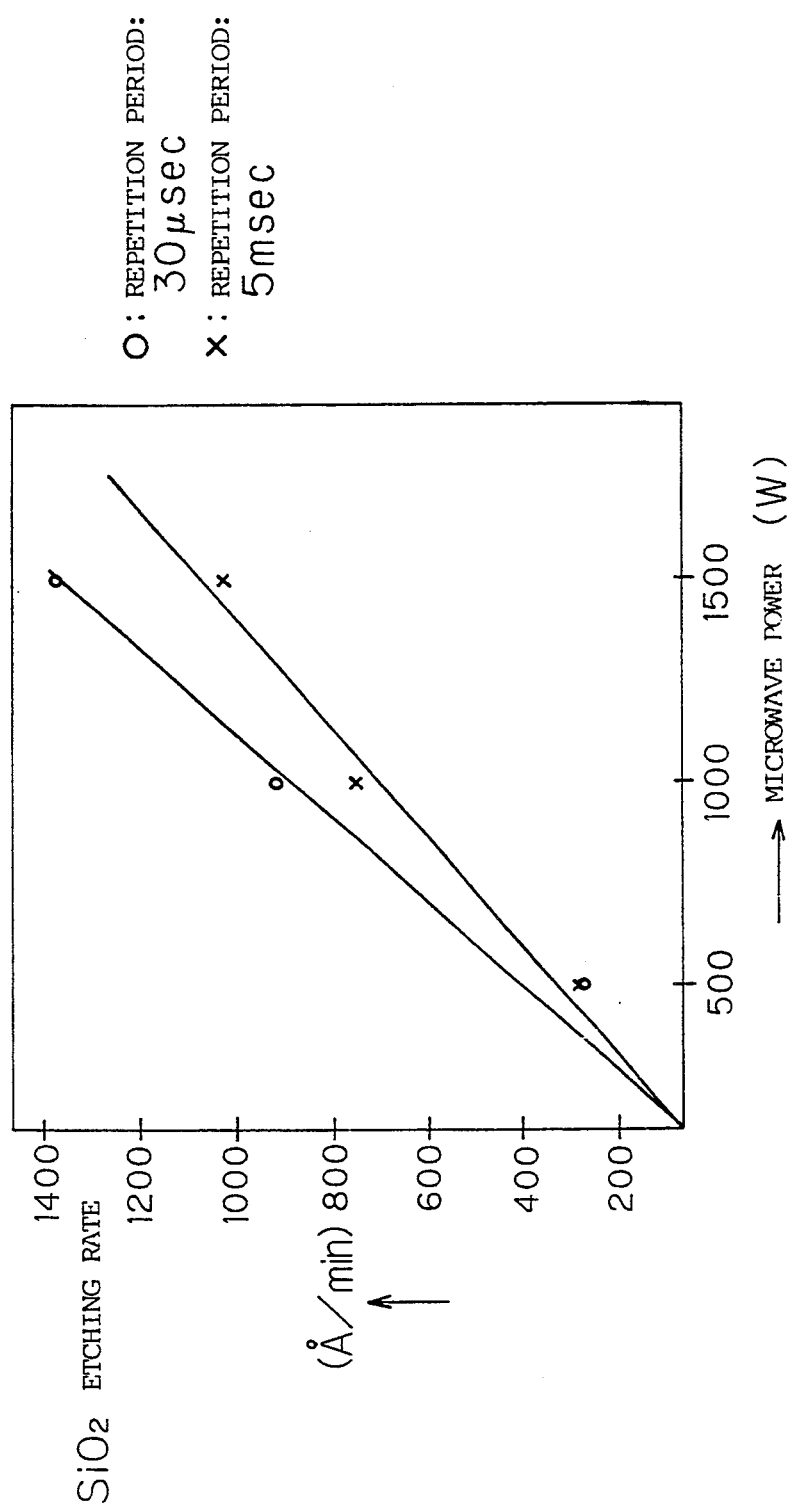
FIG. 11 is a diagram showing the relationship between etching rate and the microwave power.

When the etching rate of the microwave plasma treatment for the case where the above described microwave power is supplied to the magnetron 10 is compared to the case where the power pulses having a frequency of 100 to 200 Hz is used, the etching rate can be increased according to this embodiment. FIG. 11 shows the relationship between the etching rate and the microwave power. In FIG. 11, A indicates a characteristic obtained for the case where the repetition period of the duty factor of the microwave pulses is 30 μsec, and B indicates a characteristic obtained for the case where the repetition period of the duty factor of the microwave power pulses is 5 msec. FIG. 11 shows the etching rate for the case where the pressure within a chamber of the plasma treatment apparatus is 1.0 Torr, and the gases $O_2/CF_4$ used for the treatment have volumes of 120/800 cc. As is clear from the comparison of the characteristic A obtained by this embodiment and the characteristic B in FIG. 11, the etching rate in this embodiment is increased by 1.4 times.

In this embodiment, since the magnetron 10 is operated by a regular pulse waveform that has not been modulated, the intensity of the plasma emission becomes regular. Thus, it becomes easy to control a light-end-point detection unit that detects the intensity of plasma emission in the chamber in which the plasma is generated.

Figure 12:
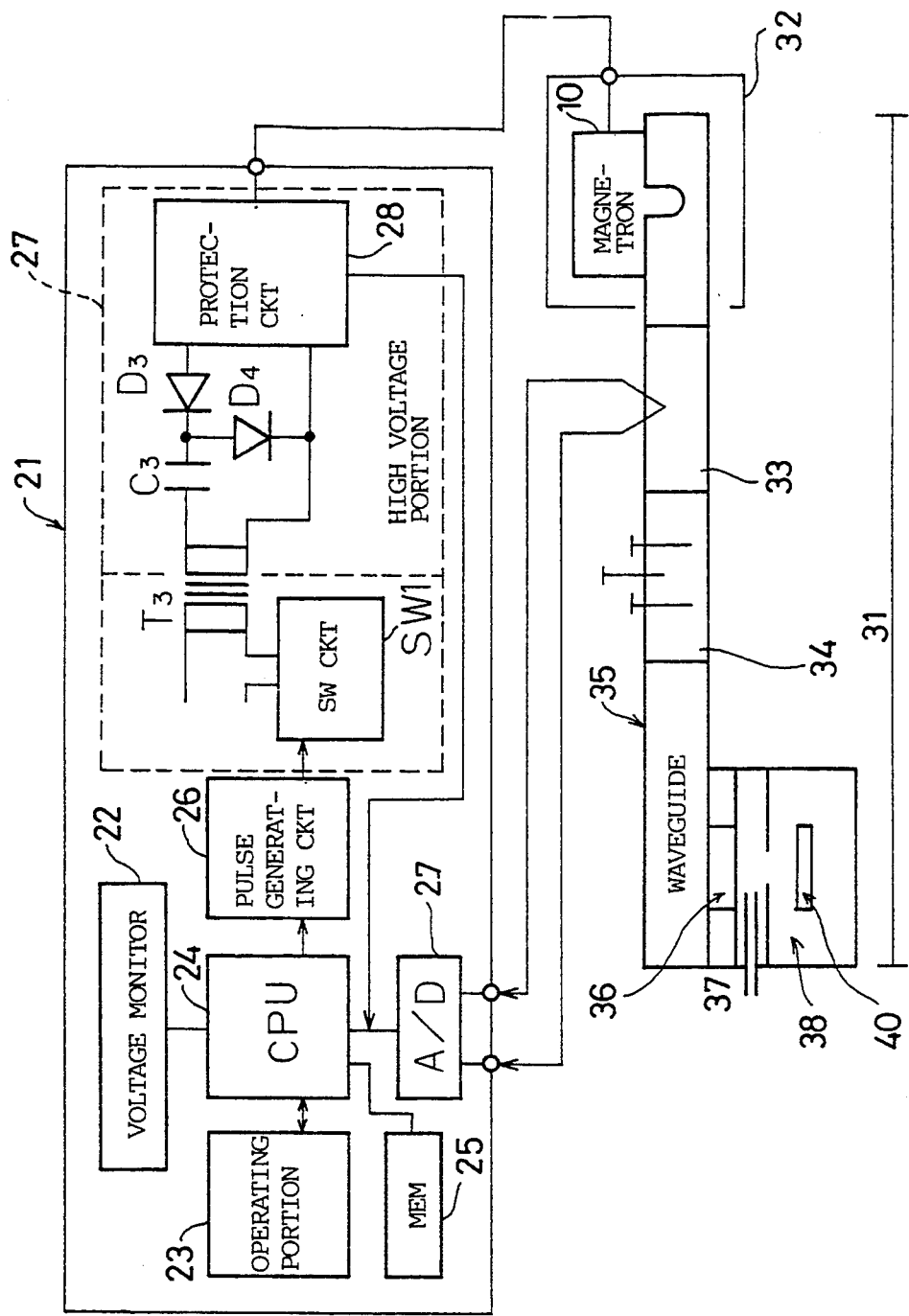
FIG. 12 is a circuit diagram showing a second embodiment of the apparatus for controlling the oscillation output of the magnetron according to the present invention.

Next, a description will be given of a second embodiment of the apparatus for controlling the oscillation output of the magnetron according to the present invention, by referring to FIG. 12. In FIG. 12, those parts which are the same as those corresponding parts in FIG. 5 are designated by the same reference numerals, and a description thereof will be omitted. FIG. 12 shows a plasma treatment apparatus applied with the apparatus for controlling the oscillation output of the magnetron, together therewith.

In FIG. 12, an apparatus 12 for controlling the oscillation output of the magnetron includes a power monitor 22, an operating portion 23, a CPU 24, a memory 25, a pulse generating circuit 26, an analog-to-digital (A/D) converter 27, a switch circuit SW1, and a high voltage portion 27. The high voltage portion 27 has a protection circuit 28 in addition to the elements shown in FIG. 5. On the other hand, a plasma processing apparatus 31 includes a magnetron housing 32, a directional coupler 33, a three-stab tuner 34, a waveguide 35, a window 36, a treatment gas inlet 37, and a vacuum chamber 38. The magnetron housing 32 houses a magnetron 10. A substrate 40 to be subjected to the plasma treatment is placed in the vacuum chamber 38. The CPU 24 is coupled to the power monitor 22, the operating portion 23, the memory 25, and the pulse generating circuit 26, the A/D converter 27, and the protection circuit 28. In FIG. 12, the illustration of the rectifier 1 is omitted.

The pulse generating circuit 26 generates pulses based on information from the CPU 24 such as pulse generating timing, pulse width, and the number of pulses. It is possible to use a known circuit for the circuit construction itself of the pulse generating circuit 26. The pulses generated by the pulse generating circuit 26 control the ON/OFF state of the switch circuit SW1. A microwave power supplied from the secondary side of the transformer T3 is applied to the magnetron 10 through the protection circuit 28. The protection circuit 28 prevents an excessive large anode current or voltage from being applied to the magnetron 10. The protection circuit 28 feeds back to the CPU 24 information related to the microwave power applied to the magnetron 10. It is also possible to use a known circuit for the circuit construction itself of the protection circuit 28. Information related to the state at the directional coupler 33 is supplied to the CPU 24 through the A/D converter 27.

The operating portion 23 inputs and sets with respect to the CPU 24 a microwave power to be applied to the magnetron 10, a microwave power to be monitored on the power monitor 22, information related to the soft-start, an anode voltage rising factor of the magnetron 10, a heater ON-time of a heater (not shown) of the magnetron 10, and the like. The CPU 24 stores such information in the memory 24. By setting the microwave power to be monitored by the power monitor 22, it becomes possible to detect an abnormality or the like of the plasma generation when the set microwave power is monitored. In addition, by setting the information related to the soft-start, it becomes possible to gradually increase the anode current of the magnetron 10 so that the magnetron 10 is trained to the impedance within the vacuum chamber 38, and prevent oscillation failure and damage to the magnetron 10 and the high voltage portion 27 which would be caused by an excessively large load on the magnetron 10. When the anode voltage rising factor of the magnetron 10 is set, the serviceable life of the magnetron 10 can be predicted by the CPU 10. Further, when the ON-time of the heater of the magnetron 10 is set, the magnetron 10 can be prevented from being damaged by outputting an alarm from the CPU 24 if the ON-time of the heater exceeds a predetermined value.

Figure 13:
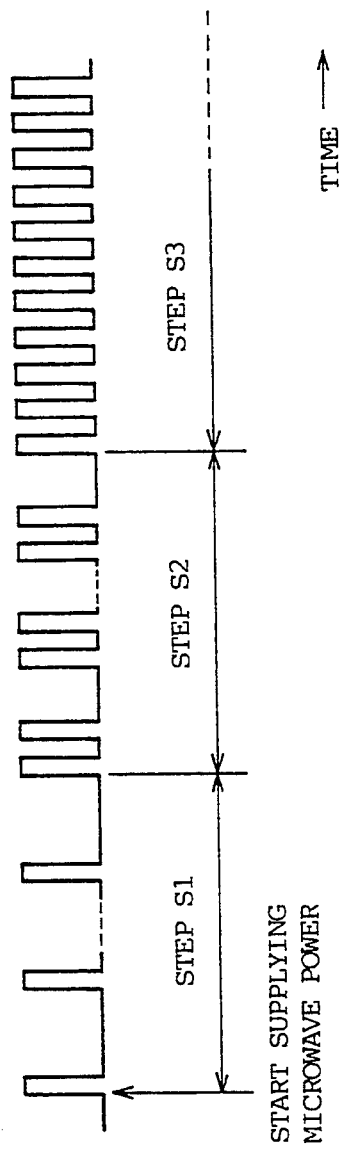
FIG. 13 is a timing diagram for explaining a soft-start operation of the second embodiment performed in 3 steps.

In this embodiment, the CPU 24 variably controls the pulse generation timing of the pulse generating circuit 28 at predetermined time intervals so as to soft-start the magnetron 10. FIG. 13 is a timing diagram for explaining a soft-start operation which is performed in three steps. In a first step S1 shown in FIG. 13, the intermittent pulse timing of the microwave power is set large, so as to prevent the magnetron 10 and the apparatus 21 from being affected by an abrupt impedance change within the vacuum chamber 38 when the plasma emission occurs. Next, in a step S2 several seconds after the plasma emission starts, for example, the CPU 24 shortens the intermittent pulse timing of the microwave power is reduced depending on the impedance that is gradually stabilizes, so as to increase the microwave output of the magnetron 10. Then, several seconds after the step S2 ends, for example, the microwave power is supplied to the magnetron 10 as pulses having the non-intermittent timing depending on the impedance that has completely stabilized. The repetition period of the duty factor of the microwave power pulses supplied to the magnetron 10 at the step S3 and after is set to 30 μsec or greater so as to saturate the etching rate without varying the amount of active seeds that contribute to the etching process.

Figure 14:
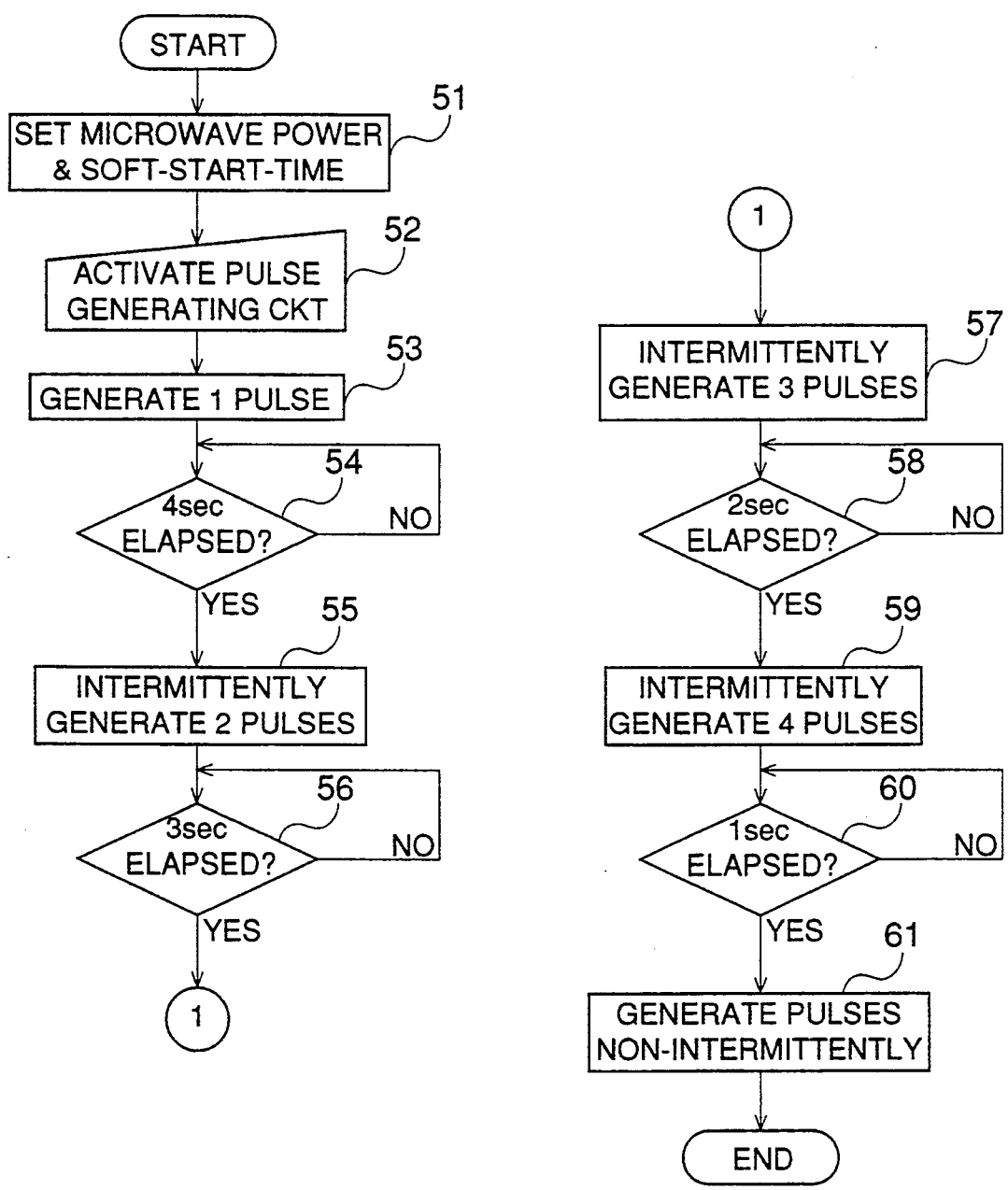
FIG. 14 is a flow chart for explaining the operation of a CPU that performs the soft-start operation.

It should be noted that the number of steps for the soft-start operation is not limited to three. Instead, the soft-start operation may be performed in n steps, where n is an integer. FIG. 14 is a flow chart showing the operation of the CPU 24 that performs the soft-start operation in five steps. In FIG. 14, a step 51 sets the microwave power which is supplied to the magnetron 10 after the soft-start operation to 1500 W and sets the soft-start time to 5 sec based on the input from the operating portion 23. The set microwave power and the set soft-start time are stored in the memory 25. A step 52 activates the pulse generating circuit 26. A step 53 controls the pulse generating circuit 26 to generate one pulse. A step 53 decides whether or not 4 sec has elapsed from a time when the switch circuit SW1 is turned ON. When the decision result of the step 54 is YES, a step 55 controls the pulse generating circuit 28 to intermittently generate two pulses. A step 58 decides whether or not 3 sec has elapsed from the time when the switch circuit SW1 is turned ON. When the decision result of the step 58 is YES, a step 57 controls the pulse generating circuit 28 to intermittently generate three pulses. A step 58 decides whether or not 1 sec has elapsed from the time when the switch circuit SW1 is turned ON. When the decision result of the step 58 is YES, a step 59 controls the pulse generating circuit 26 to intermittently generate four pulses. A step 60 decides whether or not 1 second has elapsed from the time when the switch circuit SW1 is turned ON. When the decision result of the step 60 is YES, a step 61 controls the pulse generating circuit 26 to continuously generate pulses, that is, non-intermittently. After the steps 51 to 61 are carried out, the microwave power becomes the set value which is 1500 W.

When the steps of the flow chart shown in FIG. 14 are reversely executed, the magnetron 10 can be soft-stopped.

Figure 15:
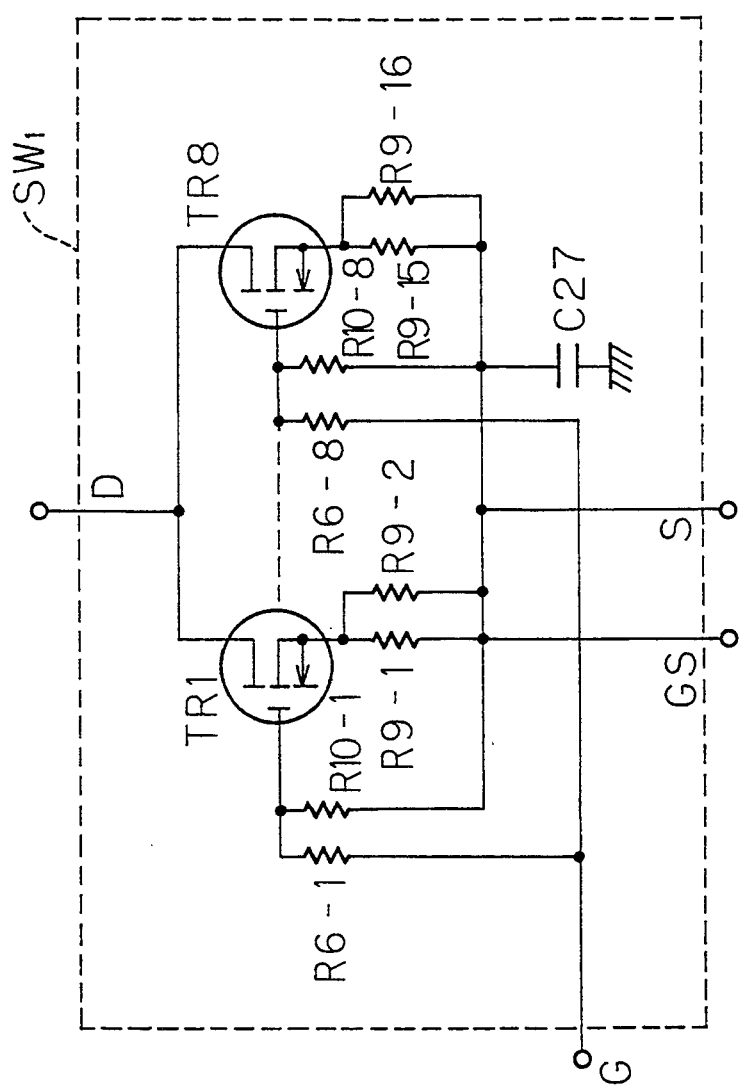
FIG. 15 is a circuit diagram showing an embodiment of a switch circuit.

In each of the aforementioned embodiments, the switch circuit SW1 may have a construction shown in FIG. 15. The switch circuit SW1 shown in FIG. 15 comprises eight depletion type transistors TR1 to TR8, resistors R6-1 to R6-8, resistors R9-1 to R9-16, resistors R10-1 to R10-8, and a capacitor C27. A terminal D is connected to a transformer T3. Terminals GS and S are connected to the rectifier 1 shown in FIG. 5. The terminal S is grounded through for example a-capacitor (not shown). Pulses from the pulse generating circuit 26 shown in FIG. 12 are applied to the terminal G.

Further, the present invention is not limited to these embodiments, but various variations and modifications may be made without departing from the scope of the present invention.

What is claimed is:

1. An apparatus for controlling an oscillation output of a magnetron, comprising:
   a switch circuit controlled of ON/OFF states thereof by a pulse signal;
   a rectifying circuit supplying microwave power pulses to said magnetron; and
   a transformer having a primary side and a secondary side, said primary side having a first terminal and a second terminal, said first terminal being coupled to an A.C. power supply, said second terminal being coupled to said switch circuit, said secondary side being coupled to said rectifying circuit,
   said switch circuit being controlled of the ON/OFF states thereof by said pulse signal so that a duty factor of the microwave power pulses output from said rectifying circuit and a repetition frequency of the duty cycle thereof become constant.

2. The apparatus as claimed in claim 1, wherein said switch circuit is controlled of the ON/OFF states thereof by said pulse signal so that the duty factor of the microwave power pulses output from said rectifying circuit becomes 50%, and wherein a peak value of the microwave power is set less than or equal to a maximum anode current of said magnetron.

3. The apparatus as claimed in claim 2, wherein said switch circuit is controlled of the ON/OFF states thereof by said pulse signal so that the repetition period of the duty factor of the microwave power pulses output from said rectifying circuit becomes a constant value that is 30 $\mu$sec or greater.

4. The apparatus as claimed in claim 1, wherein said switch circuit is controlled of the ON/OFF states thereof by said pulse signal so that the repetition period of the duty factor of the microwave power pulses output from said rectifying circuit becomes a constant value that is 30 $\mu$sec or greater.

5. The apparatus as claimed in claim 1, wherein said switch circuit is controlled of the ON/OFF states thereof by said pulse signal so that an intermittent timing of said microwave power pulses output from said rectifying circuit is variably controlled when starting or stopping said magnetron.

6. The apparatus as claimed in claim 5, wherein said switch circuit is controlled of the ON/OFF states thereof by said pulse signal so that the intermittent timing of said microwave power pulses output from said rectifying circuit gradually decreases to a non-intermittent state when soft-starting said magnetron.

7. The apparatus as claimed in claim 5, wherein said switch circuit is controlled of the ON/OFF states thereof by said pulse signal so that the intermittent timing of said microwave power pulses output from said rectifying circuit gradually increases from the non-intermittent state when soft-stopping said magnetron.

8. The apparatus as claimed in claim 1, which further comprises:
   control means for generating the pulse signal 7hich is supplied to said switch circuit.

9. A plasma processing method comprising the steps of:
   (a) supplying microwave power to a magnetron from a rectifying circuit;
   (b) controlling an oscillation output of the magnetron by controlling ON/OFF states of a switch circuit by a pulse signal so that a duty factor of the microwave power pulses output from the rectifying circuit and a repetition frequency of the duty cycle thereof become constant; and
   (c) generating plasma using the magnetron.

10. The plasma processing method as claimed in claim 9, which uses a transformer having a primary side and a secondary side, said primary side having a first terminal and a second terminal, said first terminal being coupled to an A.C. power supply, said second terminal being coupled to said switch circuit, said secondary side being coupled to said rectifying circuit.

11. The plasma processing method as claimed in claim 9, wherein said step (b) controls the ON/OFF states of the switch circuit by said pulse signal so that the duty factor of the microwave power pulses output from said rectifying circuit, becomes 50%, and a peak value of the microwave power is set less than or equal to a maximum anode current of said magnetron.

12. The plasma processing method as claimed in claim 11, wherein said step (b) controls the ON/OFF states of the switch circuit by said pulse signal so that the repetition period of the duty factor of the microwave power pulses output from said rectifying circuit becomes a constant value that is 30 $\mu$sec or greater.

13. The plasma processing method as claimed in claim 9, wherein said step (b) controls the ON/OFF states of the switch circuit by said pulse signal so that the repetition period of the duty factor of the microwave power pulses output from said rectifying circuit becomes a constant value that is 30 $\mu$sec or greater.

14. The plasma processing method as claimed in claim 9, wherein said step (b) controls the ON/OFF states of the switch circuit by said pulse signal so that an intermittent timing of said microwave power pulses output from said rectifying circuit is variably controlled when starting or stopping said magnetron.

15. The plasma processing method as set forth in claim 14, wherein said step (b) controls the ON/OFF states of the switch circuit by said pulse signal so that the intermittent timing of said microwave power pulses output from said rectifying circuit gradually decreases to a non-intermittent state when soft-starting said magnetron.

16. The plasma processing method as claimed in claim 14, wherein said step (b) controls the ON/OFF states of the switch circuit by said pulse signal so that the intermittent timing of said microwave power pulses output from said rectifying circuit gradually increases from the non-intermittent state when soft-stopping said magnetron.

17. The plasma processing method as claimed in claim 9, which further comprises the step of:
 (d) generating the pulse signal which is supplied to said switch circuit.

* * * * *